United States Patent
Lee et al.

(10) Patent No.: US 9,954,082 B1
(45) Date of Patent: Apr. 24, 2018

(54) METHOD OF FABRICATING AN EMBEDDED NONVOLATILE MEMORY DEVICE

(71) Applicant: UNITED MICROELECTRONICS CORP., Hsin-Chu (TW)

(72) Inventors: Hao-Ming Lee, Hsinchu County (TW); Sheng-Hao Lin, Hsinchu County (TW); Tzyy-Ming Cheng, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/598,260

(22) Filed: May 17, 2017

(30) Foreign Application Priority Data

Apr. 25, 2017 (CN) .......................... 2017 1 0274989
May 15, 2017 (CN) .......................... 2017 1 0340214

(51) Int. Cl.
| | | |
|---|---|---|
| H01L 21/00 | (2006.01) | |
| H01L 27/00 | (2006.01) | |
| H01L 29/00 | (2006.01) | |
| H01L 29/66 | (2006.01) | |
| H01L 27/11568 | (2017.01) | |
| H01L 27/11521 | (2017.01) | |
| H01L 29/51 | (2006.01) | |
| H01L 21/027 | (2006.01) | |

(52) U.S. Cl.
CPC .... *H01L 29/66795* (2013.01); *H01L 21/0274* (2013.01); *H01L 27/11521* (2013.01); *H01L 27/11568* (2013.01); *H01L 29/517* (2013.01)

(58) Field of Classification Search
CPC .......... H01L 21/0274; H01L 21/28273; H01L 21/32115; H01L 21/8221; H01L 27/11521; H01L 27/11568; H01L 27/115; H01L 29/66795; H01L 29/517; H01L 29/792; H01L 29/66833
See application file for complete search history.

(56) References Cited

U.S. PATENT DOCUMENTS

| | | |
|---|---|---|
| 7,052,958 B1 | 5/2006 | Fried |
| 7,329,580 B2 | 2/2008 | Choi |
| 7,619,276 B2 | 11/2009 | Zhu |
| 8,163,610 B2 | 4/2012 | Aritome |
| 2012/0175696 A1 | 7/2012 | Franzon |
| 2016/0308062 A1 | 10/2016 | Li |

OTHER PUBLICATIONS

Solovan et al., Electrical and Optical Properties of TiN Thin Films, 2013, Inorganic Materials, vol. 50, No. 1 pp. 4045, Jan. 2014.*
"Band Gap" in Encyclopedia Britannica at https://www.britannica.com/science/band-gap#Article-History, undated.*

* cited by examiner

*Primary Examiner* — Nikolay Yushin
(74) *Attorney, Agent, or Firm* — Winston Hsu

(57) ABSTRACT

A method of fabricating an embedded nonvolatile memory device is disclosed. A semiconductor substrate having thereon a fin body protruding from an isolation layer is provided. A charge storage layer crossing the fin body is formed. An inter-layer dielectric layer is deposited on the semiconductor substrate. The inter-layer dielectric layer is polished to expose a top surface of the charge storage layer. The charge storage layer is then recess etched and cut into separate charge storage structures. A high-k dielectric layer is formed on the charge storage structures. A word line is formed on the high-k dielectric layer.

14 Claims, 6 Drawing Sheets

METHOD OF FABRICATING AN EMBEDDED NONVOLATILE MEMORY DEVICE

BACKGROUND OF THE INVENTION

1. Field of the Invention

The present invention relates generally to the field of semiconductor technology. More particularly, the present invention relates to a method of fabricating an embedded nonvolatile memory (eNVM) device, which is fully compatible with the current FinFET processes.

2. Description of the Prior Art

As the semiconductor logic process advances to the nanotechnology node, the structure of the transistor elements has evolved into three-dimensional structures such as FinFET or tri-gate transistors, which significantly increases the drive current and performance of the transistor elements.

In addition, with the popularity of mobile devices, the market demand for flash memory embedded integrated circuit chip is increased. Therefore, the applicant of this case has proposed a method of making embedded nonvolatile memory, which is fully compatible with the current FinFET processes.

SUMMARY OF THE INVENTION

It is one object of the invention to provide a method of fabricating an embedded nonvolatile memory in order to solve the shortcomings of the prior art.

According to one embodiment of the invention, a method of fabricating an embedded nonvolatile memory device is disclosed. A semiconductor substrate having thereon a fin body protruding from an isolation layer is provided. A charge storage layer crossing the fin body is formed. An inter-layer dielectric layer is deposited on the semiconductor substrate. The inter-layer dielectric layer is polished to expose a top surface of the charge storage layer. The charge storage layer is then recess etched and cut into separate charge storage structures. A high-k dielectric layer is formed on the charge storage structures. A word line is formed on the high-k dielectric layer.

These and other objectives of the present invention will no doubt become obvious to those of ordinary skill in the art after reading the following detailed description of the preferred embodiment that is illustrated in the various figures and drawings.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the invention.

Before the further description of the preferred embodiment, the specific terms used throughout the text will be described below.

The term "etch" is used herein to describe the process of patterning a material layer so that at least a portion of the material layer after etching is retained. For example, it is to be understood that the method of etching silicon involves patterning a mask layer (e.g., photoresist or hard mask) over silicon and then removing silicon from the area that is not protected by the mask layer. Thus, during the etching process, the silicon protected by the area of the mask will remain.

In another example, however, the term "etch" may also refer to a method that does not use a mask, but leaves at least a portion of the material layer after the etch process is complete. The above description is used to distinguish between "etching" and "removal". When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The terms "forming", "depositing" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

According to various embodiments, for example, deposition may be carried out in any suitable known manner. For example, deposition may include any growth, plating, or transfer of material onto the substrate. Some known techniques include physical vapor deposition (PVD), chemical vapor deposition (CVD), electrochemical deposition (ECD), molecular beam epitaxy (MBE), atomic layer deposition (ALD), and plasma enhanced CVD (PECVD).

The term "substrate" described in the text is commonly referred to as a silicon substrate. However, the substrate may also be any semiconductor material, such as germanium, gallium arsenide, indium phosphide and the like. In other embodiments, the substrate may be non-conductive, such as glass or sapphire wafers.

Figure 1:
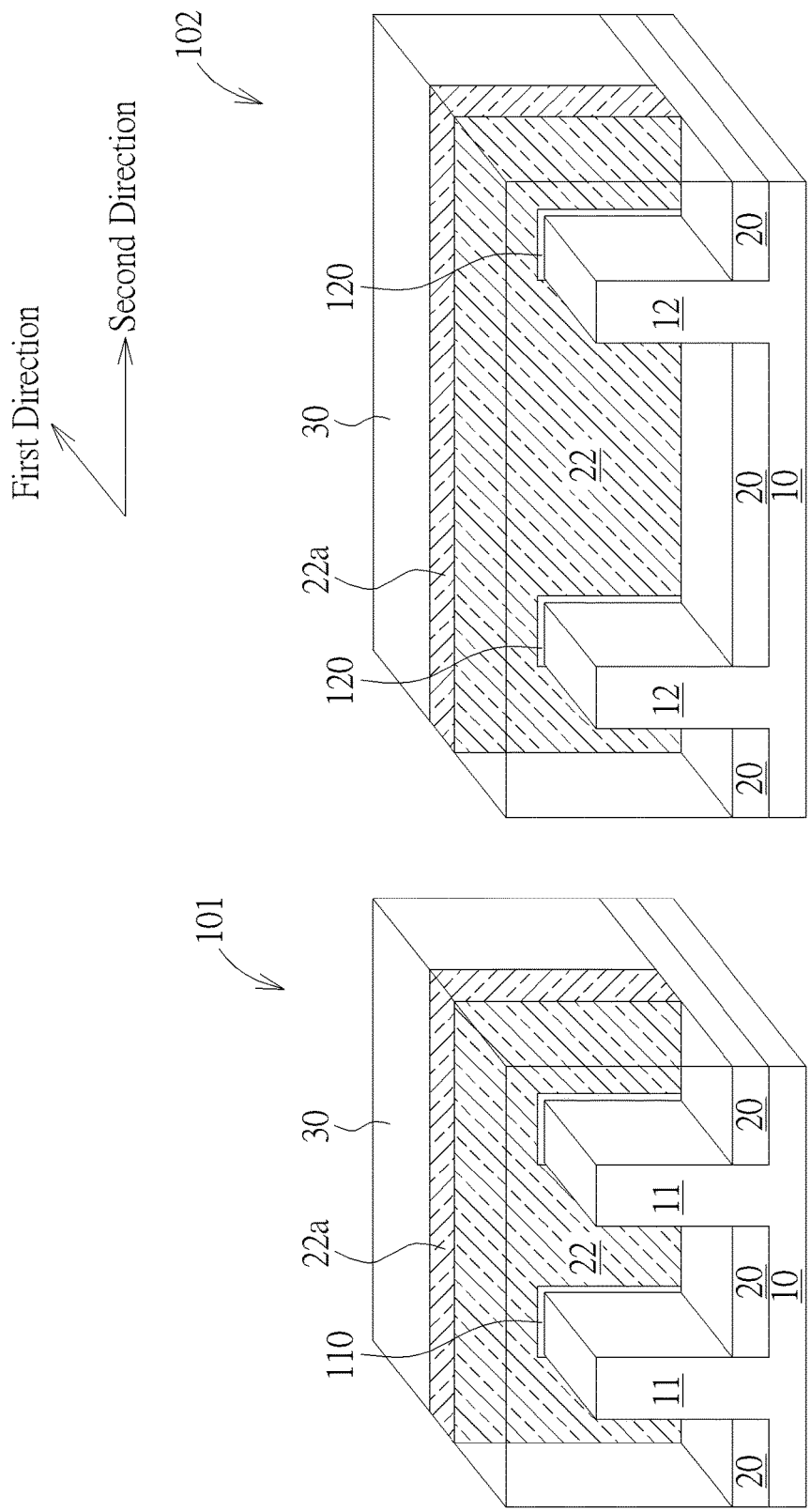
FIG. 1 to FIG. 5 are schematic, perspective views showing an exemplary method of fabricating an embedded nonvolatile memory according to one embodiment of the invention.

Please refer to FIG. 1 to FIG. 5. FIG. 1 to FIG. 5 are schematic, perspective views showing an exemplary method of fabricating an embedded nonvolatile memory according to one embodiment of the invention. As shown in FIG. 1, first, a semiconductor substrate 10 such as a silicon substrate is provided. The semiconductor substrate 10 comprises a logic circuit region 101 and an embedded nonvolatile memory (eNVM) region 102. For the sake of simplicity, only a portion of the logic circuit region 101 and only a portion of the eNVM region 102 are demonstrated.

In the logic circuit region 101, a plurality of fin bodies 11 is provided. It is understood that only two of the plurality of fin bodies 11 are demonstrated for the sake of simplicity. In the eNVM region 102, a plurality of fin bodies 12 is provided. It is understood that only two of the plurality of fin bodies 12 are demonstrated for the sake of simplicity. The fin bodies 11 and the fin bodies 12 protrude from a top surface of an isolation layer 20. According to one embodiment of the invention, the isolation layer 20 may be a trench isolation structure. According to one embodiment of the invention, the fin bodies 11 and the fin bodies 12 are straight-line shaped fin bodies, which extend along a first direction.

The fin bodies 11 and the fin bodies 12 are well-known structures in FinFET processes. Therefore, the detailed steps for forming the fin bodies 11 and the fin bodies 12 are omitted.

Subsequently, a dummy gate layer 22 is formed on the fin bodies 11 and the fin bodies 12. According to one embodiment, the dummy gate layer 22 may comprise a polysilicon layer. According to another embodiment, the dummy gate layer 22 may comprise a silicon nitride layer. The dummy gate layer 22 has a straight-line shaped pattern. The dummy gate layer 22 extends along a second direction and traverses the fin bodies 11 and the fin bodies 12. According to one embodiment, the second direction is perpendicular to the first direction.

According to one embodiment, it is one technical feature of the invention that the dummy gate layer 22 in the eNVM region 102 will not be completely removed in the subsequent steps. The remnant portion of the dummy gate layer 22 acts as a charge storage medium in the eNVM region 102.

According to one embodiment, a gate dielectric layer 110 is formed between the dummy gate layer 22 and the fin bodies 11, and a tunneling dielectric layer 120 is formed between the dummy gate layer 22 and the fin bodies 12. According to one embodiment, the gate dielectric layer 110 and the tunneling dielectric layer 120 may be composed of silicon oxide that is formed in the same process step, for example, a high-quality silicon dioxide layer formed by in-situ steam growth (ISSG) methods, but is not limited thereto.

Subsequently, an inter-layer dielectric (ILD) layer 30 is deposited on the semiconductor substrate 10 in a blanket manner. According to one embodiment, the ILD layer 30 may comprise silicon oxide. For example, the ILD layer 30 may be deposited by chemical vapor deposition (CVD) methods. The ILD layer 30 covers the fin bodies 11, the fin bodies 12, the dummy gate layer 22, and the isolation layer 20. A chemical mechanical polishing (CMP) process may be performed to polish the ILD layer 30 to thereby expose a top surface 22a of the dummy gate layer 22. At this point, the top surface 22a of the dummy gate layer 22 is flush with the top surface of the ILD layer 30.

Figure 6:
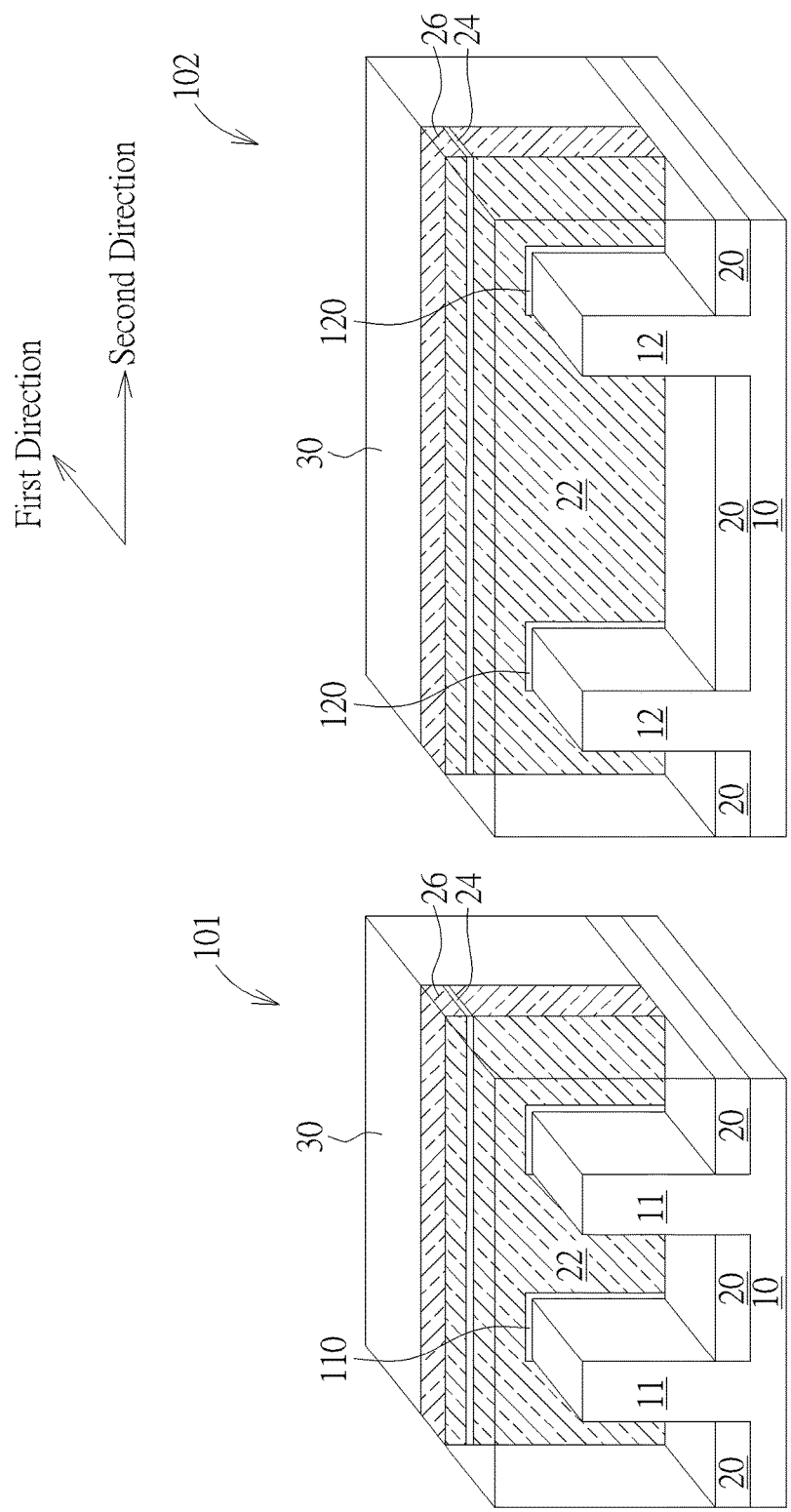
FIG. 6 is a schematic, perspective view showing an etch stop layer on the dummy gate layer and a sacrificial cap layer on the etch stop layer according to another embodiment of the invention.

According to another embodiment, as shown in FIG. 6, an etch stop layer 24 may be formed on the dummy gate layer 22, and a sacrificial cap layer 26 may be formed on the etch stop layer 24. The etch stop layer 24 may comprise silicon nitride. The sacrificial cap layer 26 may comprise silicon nitride.

Figure 2:
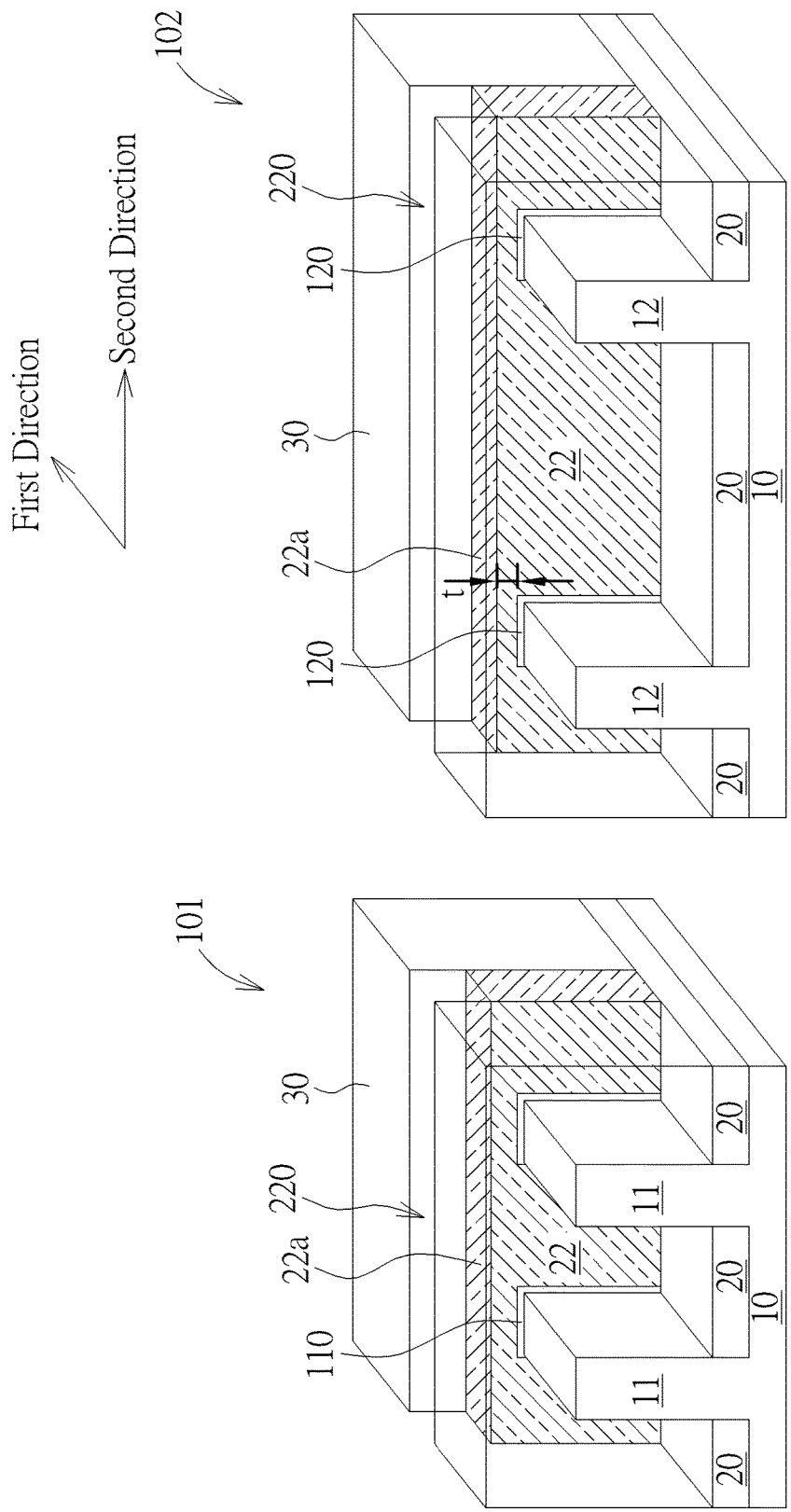

As shown in FIG. 2, a selective etching process, such as a dry etching process, is performed to recess etch the dummy gate layer 22. At this point, the top surface 22a of the dummy gate layer 22 is lower than the top surface of the ILD layer 30, and a recessed trench 220 is formed directly above the dummy gate layer 22. It is noteworthy that the remnant portion of dummy gate layer 22 that is situated directly above a top surface of each of the fin bodies 12 has a predetermined thickness t. For example, the thickness t may range between 400 angstroms and 500 angstroms, but is not limited thereto.

As previously mentioned, the remnant portion of the dummy gate layer 22 acts as a charge storage medium in the eNVM region 102. Hereinafter, the remnant portion of the dummy gate layer 22 is referred to as a charge storage layer.

As previously mentioned, the charge storage layer may comprise polysilicon or silicon nitride according to various embodiments.

Figure 3:
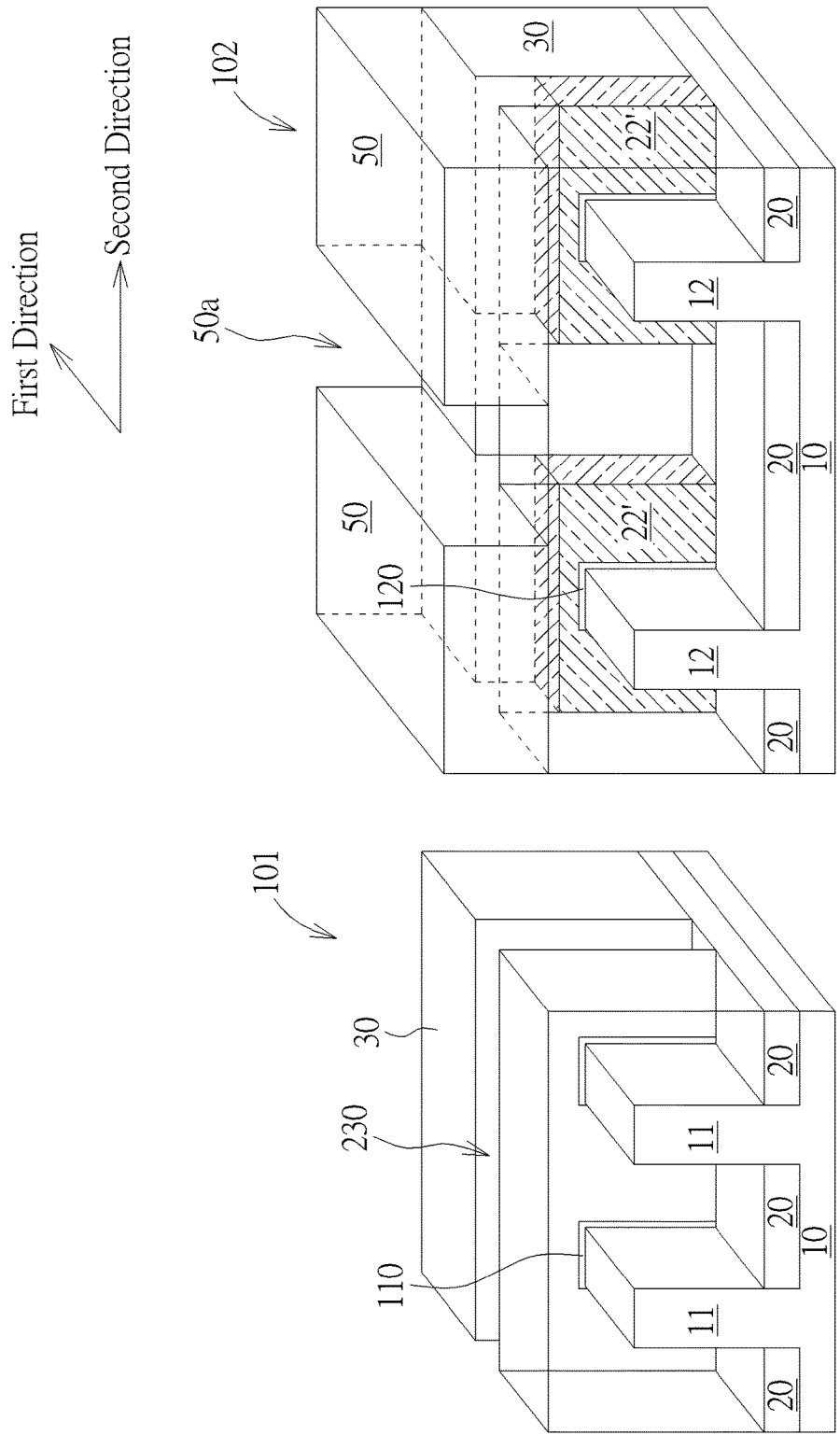

As shown in FIG. 3, a photoresist pattern 50 is formed on the ILD layer 30 and the charge storage layer 22. According to one embodiment, the photoresist pattern 50 has a straight-line shaped opening 50a extending along the first direction. When viewed from the above, the straight-line shaped opening 50a is in parallel with the fin bodies 11 and the fin bodies 12 and is disposed between two adjacent fin bodies 12.

Subsequently, an etching process is performed to selectively etch the charge storage layer 22 through the straight-line shaped opening 50a, thereby cutting the charge storage layer 22 into separate charge storage structures 22'. During the above etching process, the photoresist pattern 50 does not cover the logic circuit region 101 and therefore the dummy gate layer 22 is completely removed from the logic circuit region 101, thereby exposing the gate dielectric layer 110 and forming a trench 230. Subsequently, the photoresist pattern 50 is removed.

Figure 4:
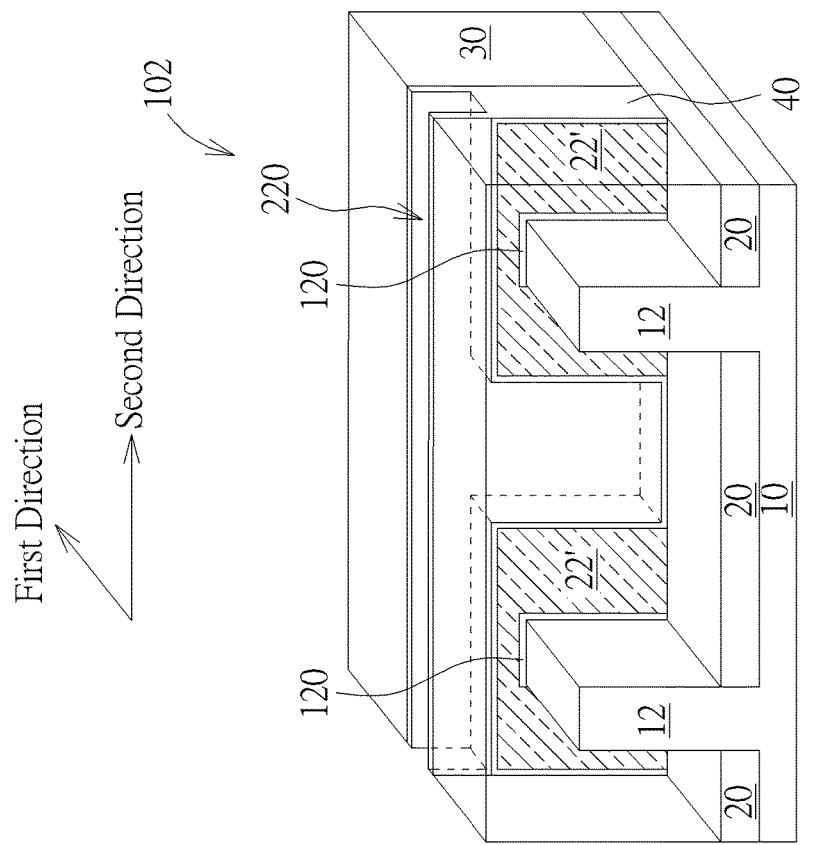
Figure 4:
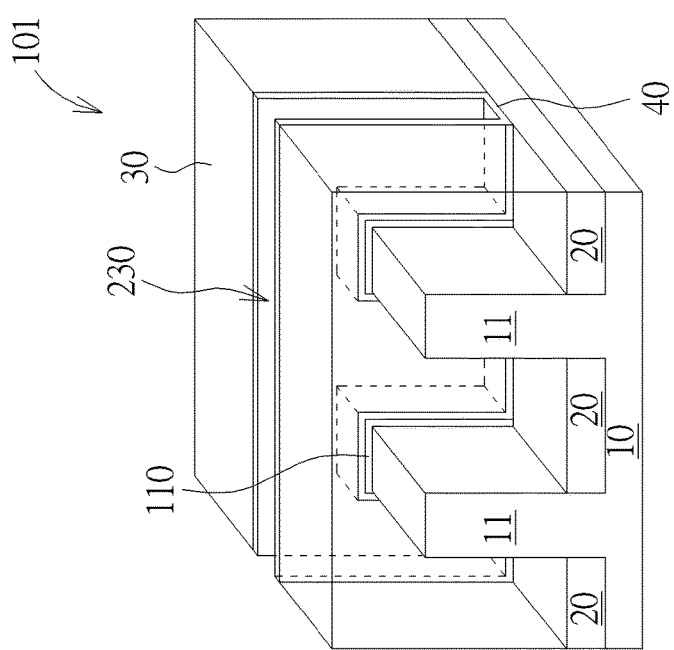

As shown in FIG. 4, a high-k dielectric layer 40 is formed on the charge storage structures 22' in the eNVM region 102 and on the gate dielectric layer 110 in the trench 230 within the logic circuit region 101. According to one embodiment, the high-k dielectric layer is composed of a material selected from the group including hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), or barium strontium titanate ($Ba_xSr_{1-x}TiO_3$, BST). The high-k dielectric layer 40 formed on the charge storage structures 22' in the eNVM region 102 functions as a capacitor dielectric layer.

According to one embodiment, for example, the high-k dielectric layer 40 may be formed by CVD methods or atomic layer deposition (ALD) methods. According to one embodiment, the high-k dielectric layer 40 may also be deposited conformally on the top surface of the ILD layer 30, which is not explicitly shown in this figure.

Figure 5:
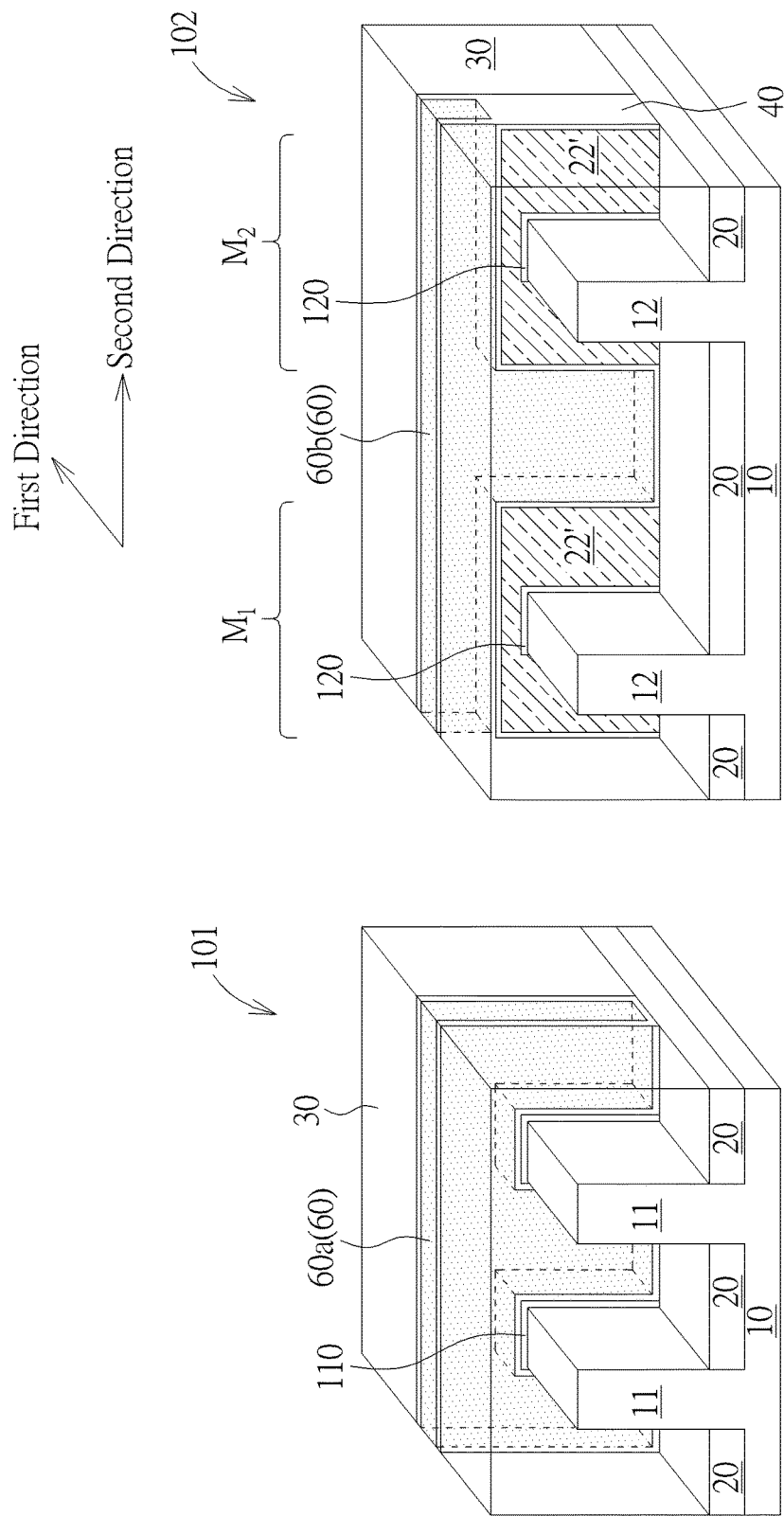

As shown in FIG. 5, a metal layer 60 such as tungsten, titanium, etc. may be deposited on the high-k dielectric layer 40. Subsequently, a CMP process may be carried out to polish away the metal layer 60 and the high-k dielectric layer 40 from the top surface of the ILD layer 30.

The remnant portions of the metal layer 60 after the CMP process in the trench 230 and the in the recessed trench 220 may constitute the gate electrode 60a in the logic circuit region 101 and the word line 60b in the eNVM region 102 respectively. At this point, a top surface of the word line 60b is flush with the top surface of the ILD layer 30. The fabrication of the exemplary eNVM cells $M_1$ and $M_2$ is complete.

It is advantageous to use the present invention method because the fabrication of the eNVM cells $M_1$ and $M_2$ is compatible with the replacement metal gate (RMG) process of fabricating the FinFET in the logic circuit region 101 as illustrated through FIG. 1 to FIG. 5. By taking advantage of the polysilicon dummy gate layer typically used in the FinFET processes, the remnant portions of the dummy gate layer may be kept in the eNVM region and may function as a charge storage medium. The present invention method further incorporates HK-last process to form the capacitor dielectric layer of the eNVM cells. At last, the metal gate process is performed to concurrently complete the formation of the metal gate in the logic circuit region 101 and the word line in the eNVM region 102.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating an embedded nonvolatile memory device, comprising:
   providing a semiconductor substrate having thereon a fin body protruding from an isolation layer;
   forming a charge storage layer crossing the fin body;
   depositing an inter-layer dielectric layer on the semiconductor substrate;
   polishing the inter-layer dielectric layer to thereby expose a top surface of the charge storage layer;
   recess etching the charge storage layer;
   cutting the charge storage layer into separate charge storage structures;
   forming a high-k dielectric layer on the charge storage structures; and
   forming a word line on the high-k dielectric layer.

2. The method according to claim 1, wherein the charge storage layer comprises polysilicon.

3. The method according to claim 1, wherein the charge storage layer comprises silicon nitride.

4. The method according to claim 1, wherein the high-k dielectric layer is composed of a material selected from the group including hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), or barium strontium titanate ($Ba_xSr_{1-x}TiO_3$, BST).

5. The method according to claim 1 further comprising:
   forming a tunneling dielectric layer between the charge storage layer and the fin body.

6. The method according to claim 5, wherein the tunneling dielectric layer comprise a silicon oxide layer.

7. The method according to claim 1, wherein the fin body is a straight-line shaped fin body extending along a first direction, and the charge storage layer is a straight-line shaped charge storage layer extending along a second direction that is perpendicular to the first direction.

8. The method according to claim 7, wherein said cutting the charge storage layer into separate charge storage structures comprises:
   forming a photoresist pattern comprising a straight-line shaped opening extending along the first direction on the inter-layer dielectric layer and the charge storage layer;
   selectively etching the charge storage layer through the straight-line shaped opening, thereby forming said separate charge storage structures; and
   removing the photoresist pattern.

9. The method according to claim 1 further comprising:
   forming an etch stop layer on the charge storage layer; and
   forming a sacrificial cap layer on the etch stop layer.

10. The method according to claim 9, wherein the etch stop layer comprise silicon nitride.

11. The method according to claim 9, wherein the sacrificial cap layer comprises polysilicon.

12. The method according to claim 1, wherein after polishing the inter-layer dielectric layer to thereby expose the top surface of the charge storage layer, the top surface of the charge storage layer is flush with a top surface of the inter-layer dielectric layer.

13. The method according to claim 12, wherein the word line comprises metal.

14. The method according to claim 13, wherein a top surface of the word line is flush with the top surface of the inter-layer dielectric layer.

\* \* \* \* \*